United States Patent
Lee et al.

(10) Patent No.: US 9,002,304 B2
(45) Date of Patent: Apr. 7, 2015

(54) ANALOG BASEBAND FILTER APPARATUS FOR MULTI-BAND AND MULTI-MODE WIRELESS TRANSCEIVER AND METHOD FOR CONTROLLING THE FILTER APPARATUS

(71) Applicant: Samsung Electronics Co. Ltd., Suwon-si, Gyeonggi-do (KR)

(72) Inventors: Jong-Woo Lee, Seongnam-si (KR); Shin-Chul Kim, Yongin-si (KR); Su-Seob Ahn, Seoul (KR); Si-Bum Jun, Hwaseong-si (KR); Byung-Ki Han, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 170 days.

(21) Appl. No.: 13/864,768

(22) Filed: Apr. 17, 2013

(65) Prior Publication Data

US 2014/0065992 A1    Mar. 6, 2014

Related U.S. Application Data

(60) Provisional application No. 61/695,712, filed on Aug. 31, 2012.

(30) Foreign Application Priority Data

Jan. 2, 2013    (KR) .......................... 10-2013-0000361

(51) Int. Cl.
*H04B 1/18*    (2006.01)
*H04B 1/12*    (2006.01)
*H03H 11/12*    (2006.01)

(52) U.S. Cl.
CPC ............ *H04B 1/126* (2013.01); *H03H 11/1291* (2013.01)

(58) Field of Classification Search
USPC ........ 455/168.1, 213, 306, 307, 339; 327/355
See application file for complete search history.

(56) References Cited

U.S. PATENT DOCUMENTS

| | | | | |
|---|---|---|---|---|
| 4,751,666 A * | 6/1988 | Gillingham | ....................... | 708/3 |
| 7,403,508 B1 * | 7/2008 | Miao | .............................. | 370/335 |
| 7,453,927 B2 * | 11/2008 | Vepsalainen et al. | ......... | 375/219 |
| 7,937,058 B2 | 5/2011 | Rahman et al. | | |
| 8,000,302 B2 * | 8/2011 | Filipovic | ........................ | 370/335 |
| 8,862,648 B2 * | 10/2014 | Kuo | .............................. | 708/309 |
| 2002/0127982 A1 * | 9/2002 | Haapoja et al. | ............... | 455/130 |
| 2004/0041626 A1 * | 3/2004 | Yokoyama | ....................... | 330/10 |

(Continued)

FOREIGN PATENT DOCUMENTS

KR    10-2009-0068339 A    6/2009

*Primary Examiner* — Minh D Dao
(74) *Attorney, Agent, or Firm* — Jefferson IP Law, LLP

(57) ABSTRACT

An analog baseband filter apparatus for a multi-mode and multi-band wireless transceiver and a method for controlling the analog baseband filter apparatus are provided. The analog baseband filter apparatus includes a plurality of Radio Frequency (RF) units, each of the plurality of RF units being for receiving RF signals of one of a plurality of frequency bands and outputting baseband signals, a plurality of filter blocks for filtering and amplifying the baseband signals, and a switching unit for connecting at least two of the plurality of RF units to at least one of the plurality of filter blocks according to a selected communication mode, wherein the at least one of the plurality of filter blocks is configured to be connected to a capacitor region of an adjacent filter block from among the plurality of filter blocks.

12 Claims, 15 Drawing Sheets

(56) References Cited

U.S. PATENT DOCUMENTS

| | | | |
|---|---|---|---|
| 2005/0026564 A1* | 2/2005 | Haub et al. | 455/67.11 |
| 2006/0291549 A1* | 12/2006 | Seppinen et al. | 375/227 |
| 2007/0160179 A1* | 7/2007 | Narathong et al. | 377/47 |
| 2008/0042699 A1* | 2/2008 | Narathong et al. | 327/117 |
| 2010/0022215 A1* | 1/2010 | Ganger et al. | 455/339 |
| 2010/0144292 A1* | 6/2010 | Kim | 455/129 |
| 2010/0149842 A1* | 6/2010 | McPhalen et al. | 363/39 |
| 2012/0013387 A1* | 1/2012 | Sankaranarayanan et al. | 327/355 |
| 2012/0293223 A1* | 11/2012 | Watanabe | 327/157 |
| 2013/0259158 A1* | 10/2013 | Zarei | 375/296 |
| 2014/0242926 A1* | 8/2014 | Kim et al. | 455/90.2 |

* cited by examiner

ANALOG BASEBAND FILTER APPARATUS FOR MULTI-BAND AND MULTI-MODE WIRELESS TRANSCEIVER AND METHOD FOR CONTROLLING THE FILTER APPARATUS

PRIORITY

This application claims the benefit under 35 U.S.C. §119 (e) of a U.S. Provisional patent application filed on Aug. 31, 2012 in the U.S. Patent and Trademark Office and assigned Ser. No. 61/695,712, and under 35 U.S.C. §119(a) of a Korean patent application filed on Jan. 2, 2013 in the Korean Intellectual Property Office and assigned Serial No. 10-2013-0000361, the entire disclosure of each of which is hereby incorporated by reference.

BACKGROUND OF THE INVENTION

1. Field of the Invention

The present invention relates to a wireless communication system. More particularly, the present invention relates to an apparatus for filtering an analog baseband signal in a multi-mode and multi-band wireless transceiver and a method for controlling the apparatus.

2. Description of the Related Art

In a receiver of wireless communication, an analog filter is used to filter unnecessary noise from a signal that is demodulated into a baseband by a mixer and to select a signal of a desired channel. In the analog filter, an accurate cut-off frequency setting has a significant influence upon system performance.

Generally, a filter has an input-to-output gain value which changes as a frequency value increases, and the filter has also a pass band and a stop band. A cut-off frequency $f_c$ refers to a boundary frequency that is between the pass band and the stop band. A Low Pass Filter (LPF) defines a cut-off frequency $f_c$, which is a frequency having a gain value which is 3 dB lower than a gain value of a direct current or a low frequency in the pass band. The cut-off frequency $f_c$ is determined by a feedback resistor and a feedback capacitor, both of which are used in the analog filter.

A baseband used in mobile communication systems covers a very large range of frequencies from a bandwidth of 100 kHz for 2nd Generation (2G) communication systems to a bandwidth of 20 MHz for 3rd Generation (3G) or 4th Generation (4G) communication systems, wherein the highest bandwidth of the baseband is about 100 times the lowest bandwidth. A multi-mode mobile terminal, which uses a 2G mode for voice communication and uses a 3G or 4G (hereinafter, '3G/4G') mode for data communication, should have a multi-mode and multi-band wireless transceiver that uses an analog baseband filter that is capable of supporting the foregoing diverse bandwidths of the baseband.

However, a resistor value, which may also be referred to as a resistance, and a capacitor value, which may also be referred to as a capacitance, which determine the cut-off frequency $f_c$ of the analog baseband filter change according to temperature and process conditions, and the resistance and capacitance are difficult to accurately estimate, such that in an actual environment, the cut-off frequency $f_c$ may be different from a target value. Hence, the cut-off frequency $f_c$ is corrected by controlling a variable resistor and/or a variable capacitor with a digital algorithm, and an error of correction needs to be less than 4%.

The cut-off frequency $f_c$ is inversely proportional to a product of a resistor value and a capacitor value, such that in order to process a signal in a low band, such as 2G, a resistor and a capacitor having very large values are needed, and accordingly, an area and/or physical size of the analog filter may increase. A capacitor for processing a low band of 2G may be several times larger in size than that in a 3G/4G, thus increasing a circuit area of the analog filter several times. As such, when the 3G/4G mode operates, the circuit area of the analog filter significantly increases due to the idle 2G mode, thus increasing the processing cost with respect to power, computation and other similar resources. Moreover, as the circuit area increases, a path length of a signal travelling through the circuit increases, thus increasing an error of the signal and noise, and thus degrading characteristics of the signal.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide an apparatus for filtering an analog signal in a wireless transceiver and a method for controlling the apparatus.

Another aspect of the present invention is to provide a variable-gain amplifier and a variable-frequency filter for processing diverse signal bands using a single architecture.

Another aspect of the present invention is to provide an apparatus for minimizing a circuit area of an analog baseband filter for multi-mode and multi-band use and a method for controlling the apparatus.

Another aspect of the present invention is to provide an apparatus for sharing a capacitor of a diversity path in a multi-mode and multi-band wireless transceiver and for improving an architecture of input and feedback resistors, and a method for controlling the apparatus.

Another aspect of the present invention is to provide an apparatus in which a plurality of analog baseband filters are concatenated and used in a multi-mode and multi-band receiver and a method for controlling the apparatus.

In accordance with an aspect of the present invention, an analog baseband filter apparatus for a multi-mode and multi-band wireless transceiver is provided. The analog baseband filter apparatus includes a plurality of Radio Frequency (RF) units, each of the plurality of RF units being for receiving RF signals of one of a plurality of frequency bands and outputting baseband signals, a plurality of filter blocks for filtering and amplifying the baseband signals, and a switching unit for connecting at least two of the plurality of RF units to at least one of the plurality of filter blocks according to a selected communication mode, wherein the at least one of the plurality of filter blocks is configured to be connected to a capacitor region of an adjacent filter block from among the plurality of filter blocks.

In accordance with another aspect of the present invention, a method for controlling an analog baseband filter apparatus for a multi-mode and multi-band wireless transceiver is provided. The method includes connecting a plurality of Radio Frequency (RF) units, each of the plurality of RF units being for receiving RF signals of a High Band (HB) and outputting baseband signals to a plurality of filter blocks for respectively filtering and amplifying the baseband signals in a first communication mode which uses the HB and connecting two RF units from among the plurality of RF units to second and third filter blocks of the plurality of filter blocks in a second communication mode which uses a Low Band (LB), wherein, when in the second communication mode, capacitor regions of the second and third filter blocks are respectively connected with capacitor regions of respectively adjacent first and fourth filter blocks.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

Figure 1:
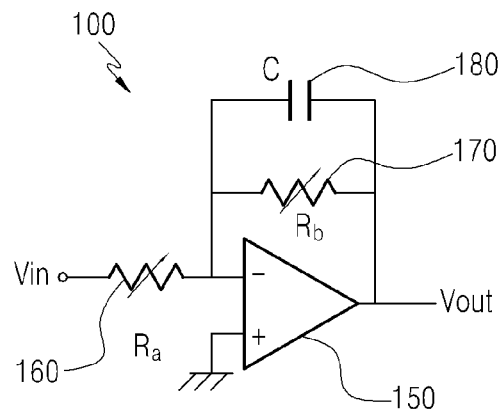
FIG. 1 is a diagram illustrating a structure of an analog filter having a characteristic function of a primary frequency filter according to an exemplary embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The present invention is not limited by exemplary embodiments provided in the drawings and the specification. Throughout the drawings, like reference numerals refer to like members. The drawings have been simplified and relatively exaggerated to emphasize the features of the present invention, and dimensions in the drawings do not accurately match the dimensions of actual products of the present invention. Those of ordinary skill in the art may easily modify dimensions, such as length, circumference, and thickness, of each component from the disclosure of the drawings for application into an actual product, and it will be obvious to those of ordinary skill in the art that such modification falls within the scope of the present invention.

The following exemplary embodiments of the present invention relate to an analog filter for filtering an analog signal, and more particularly, to a multi-mode and multi-band analog baseband filter. An Analog BaseBand (ABB) filter may be used for wireless transceivers which support bandwidths of different wireless communication techniques, such as Global System for Mobile communications (GSM), Enhanced Data GSM Environment (EDGE), High Speed Packet Access (HSPA), Wideband Code Division Multiple Access (WCDMA), Long Term Evolution (LTE) 1.4M, LTE 3M, LTE 5M, LTE 10M, LTE 15M, and LTE 20M, and any other similar and/or suitable wireless communication technique.

FIG. 1 is a diagram illustrating a structure of an analog filter having a characteristic function of a primary frequency filter according to an exemplary embodiment of the present invention.

Referring to FIG. 1, an analog filter 100 includes an operation amplifier (OP AMP) 150 which receives an input voltage Vin at a negative (−) terminal through an input resistor 160 having a resistance value of $R_a$ and a positive (+) terminal that is grounded. The analog filter 100 also includes a feedback resistor 170, having a resistance value of $R_b$, and a feedback capacitor 180, having a capacitance value of C, which are both connected between the negative (−) terminal and an output Vout of the OP AMP 150. The resistors 160 and 170 may be variable resistors, and a gain value and a cut-off frequency of the analog filter 100 may be changed by changing resistor values of the resistors 160 and 170. A gain value and a cut-off frequency of a direct current of the analog filter 100 are expressed as follows:

$$\text{Gain}: R_b/R_a \quad fc: 1/(2\pi R_b C) \qquad \text{Equation 1.}$$

In Equation 1, $R_a$ indicates a resistor value of the input resistor 160, $R_b$ indicates a resistor value of the feedback resistor 170, and C indicates a capacitance of the feedback capacitor 180. As such, the cut-off frequency $f_c$ is inversely proportional to the feedback resistor value $R_b$ and the feedback capacitor value C. Herein, $R_b$ and C are controlled by a digital code in order to increase linearly or exponentially.

A receiver filter applied to a Radio Frequency (RF) circuit may typically be composed of three through seven stages by serially combining a Real Pole (RP) filter having one RP, as illustrated in FIG. 1, and a plurality of Bi-Quad (BQ) filters, for example BQ filters two through six, having one or more RPs.

A baseband used in mobile communication systems may cover a very large range from a bandwidth of 100 kHz, for 2 G communication systems such as GSM, to a bandwidth of 20 MHz, for 4 G communication systems such as LTE. Table 1 shows examples of cut-off frequencies for standardized mobile communication basebands.

TABLE 1

| Mode | 2G | | 3G | | 4G | | | | | |
|---|---|---|---|---|---|---|---|---|---|---|
| Standard | GSM | EDGE | HSPA SC | HSPA DC | LTE1.4 | LTE3 | LTE5 | LTE10 | LTE15 | LTE20 |
| BW | 100 kHz | 100 kHz | 1.92 MHz | 4.42 MHz | 615 kHz | 1.5 MHz | 2.5 MHz | 5 MHz | 7.5 MHz | 10 MHz |

Herein, mobile communication systems of HSPA Single Carrier (SC) and HSPA Dual Carrier (DC) are included. In a 3G or 4G (hereinafter, '3G/4G') mode, an additional frequency band for diversity may be used through an additional reception antenna, in addition to a frequency band for a reception antenna used for basic services. With respect to the exemplary embodiments described herein, the two frequency bands will be referred to as a Primary (PRX) High Band (HB) for the basic services and a Diversity (DRX) HB for the additional frequency band.

Figure 2A:
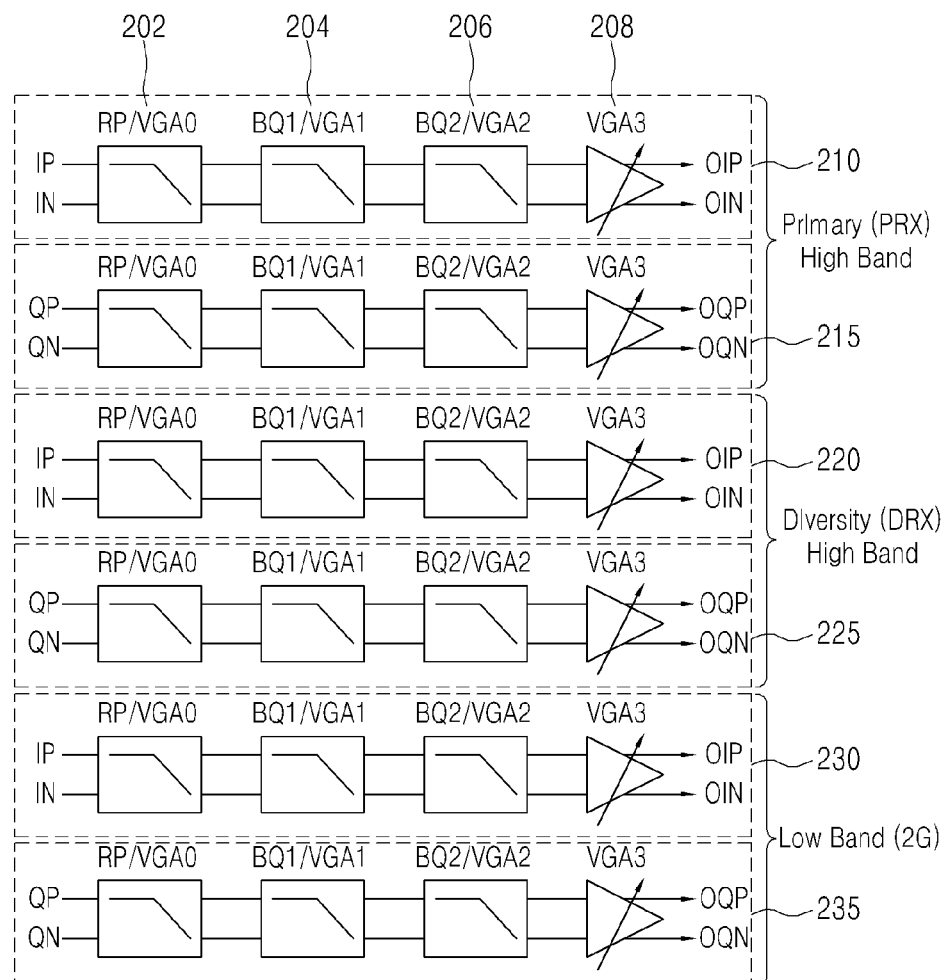
FIGS. 2A and 2B are a block diagram and a floor plane illustrating an analog baseband filter, respectively according to an exemplary embodiment of the present invention.
Figure 2B:
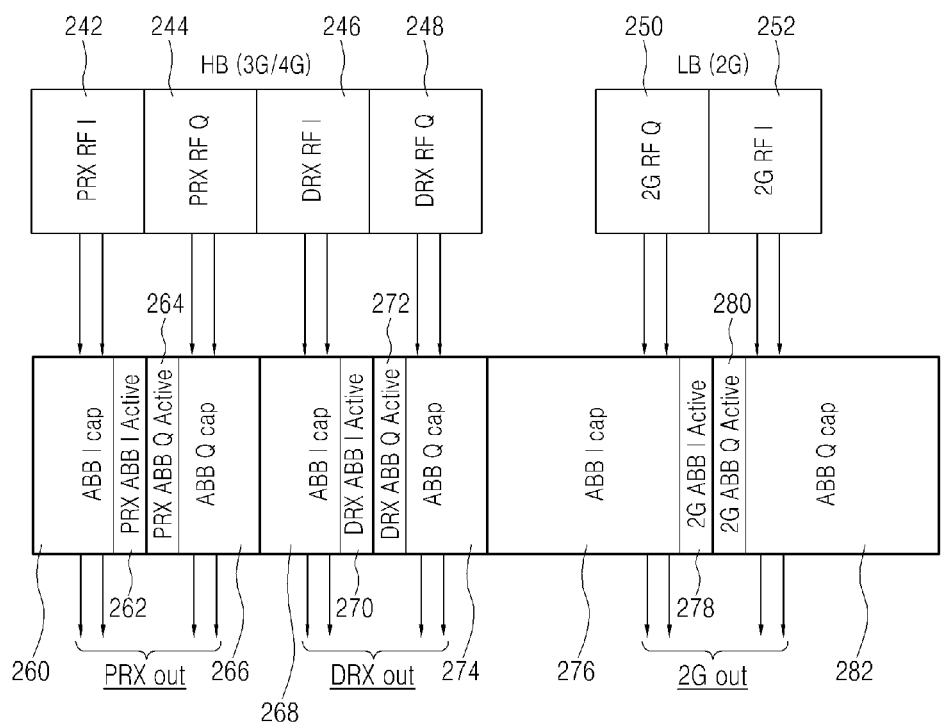

FIGS. 2A and 2B are a block diagram and a floor plane of an analog baseband filter, respectively according to an exemplary embodiment of the present invention.

Referring to FIG. 2A, an analog baseband filter includes a first filtering and amplifying path 210 and a second filtering and amplifying path 215 for an In-phase (I) signal and a Quadrature-phase (Q) signal of a 3G/4G mode PRX HB. The analog baseband filter also includes a third filtering and amplifying path 220 and a fourth filtering and amplifying path 225 for I and Q signals of a 3G/4G mode DRX HB, and a fifth filtering and amplifying path 230 and a sixth filtering and amplifying path 235 for I and Q signals of a 2G mode Low Band (LB).

The respective filtering and amplifying paths 210 through 235 include I/Q chains for filtering and amplifying (hereinafter, filtering/amplifying) the I or Q signal. More specifically, the first filtering/amplifying path 210 includes an RP filter 202 connected to a positive (+) input IP and a negative (−) input IN of the I signal of the PRX HB, a first BQ filter 204 and a second BQ filter 206, and a Variable-Gain Amplifier (VGA) 208 connected to an IP output OIP and an IN output OIN. The RP filter 202, the first and second BQ filters 204 and 206, and the VGA 208 are sequentially serially connected. The second filtering/amplifying path 215 includes three filters and a VGA in a manner similar to the first filtering/amplifying path 210, and receives QP and QN and outputs OQP and OQN. Likewise, the other filtering/amplifying paths 220 through 234 also include three filters and a VGA which are connected in series.

Referring to FIG. 2B, a floor plan of a circuit corresponding to the analog baseband filtering/amplifying paths 210 through 235 of FIG. 2A is illustrated. FIG. 2B shows a connection relationship between the filtering/amplifying paths 210 through 235 and RF units for inputting I/Q signals to the filtering/amplifying paths 210 through 235 and an internal arrangement of the respective filtering/amplifying paths 210 through 235.

A PRX RF I unit 242 receives an RF signal of the PRX HB, frequency down-converts the received RF signal into an I signal of a baseband, and forwards the baseband I signal to a corresponding first filter block having a capacitor region 260 and an active region 262, which is equivalent to the first filtering/amplifying path 210 of FIG. 2A. A PRX RF Q unit 244 receives a Q signal of the PRX HB and forwards the received Q signal to a corresponding second filter block having an active region 264 and a capacitor region 266. A DRX RF I unit 246 receives an I signal of the DRX HB and forwards the received I signal to a corresponding third filter block having a capacitor region 268 and an active region 270.

A DRX RF Q unit 248 receives a Q signal of the DRX HB and forwards the received Q signal to a corresponding fourth filter block having an active region 272 and a capacitor region 274. Likewise, filter blocks having the active regions and capacitor regions 264 through 274 are equivalent to the second through fourth filtering/amplifying paths 215 through 225 of FIG. 2A.

A 2G RF Q unit 250 receives an RF signal of a 2G LB, frequency down-converts the received RF signal to a Q signal of the baseband, and forwards the baseband Q signal to a corresponding fifth filter block having a capacitor region 276 and an active region 278, which is equivalent to the fifth filtering/amplifying path 230 of FIG. 2A. A 2G RF I unit 252 receives an RF signal of a 2G LB, frequency down-converts the received RF signal to an I signal of the baseband, and forwards the baseband I signal to a corresponding sixth filter block having an active region 280 and a capacitor region 282, which is equivalent to the sixth filtering/amplifying path 235 of FIG. 2A.

Elements of the filter block 210 of FIG. 2A may be classified into passive elements such as resistors or capacitors and active elements such as OP AMPs. Thus, the first filter block includes the capacitor region 260 including a capacitor bank and resistors and an active region 262 including OP AMPs. Similarly, the second through sixth filter blocks (264 through 282) include capacitor regions 266, 268, 274, 276, and 282 and active regions 264, 270, 272, 278, and 280, respectively. To facilitate circuit manufacturing, adjacent filter blocks are typically configured such that identical regions are adjacent to each other. For example, the active region 262 of the first filter block is disposed adjacent to the active region 264 of the second filter block, and the capacitor region 266 of the second filter block is disposed adjacent to the capacitor region 268 of the third filter block. The active region 270 of the third filter block is disposed adjacent to the active region 272 of the fourth filter block. Likewise, the capacitor region 274 of the fourth filter block is disposed adjacent to the capacitor region 276 of the fifth filter block, and the active region 278 of the fifth filter block is disposed adjacent to the active region 280 of the sixth filter block. In other words, I path and Q path of each band are symmetric to each other on the floor plan.

As stated above, since the cut-off frequency $f_c$ is inversely proportional to a product of a resistor value and a capacitor value, to process an LB signal such as a 2G signal, a resistor and a capacitor having very large values are required. As a result, the circuit area of the capacitor regions 276 and 282 of the fifth and sixth filter blocks for the 2G mode is much larger, i.e., about 2 times larger, than that of the capacitor regions 260, 266, 268, and 274 for the 3G/4G mode.

If the entire range of the baseband is processed merely with control of resistor values, instead of using capacitors occupying a large area, then the circuit area may be reduced, however an influence of noise may increase. More specifically, noise generated in a real wireless environment is proportional to an input resistor value at the first filter stage 202, as expressed by Equation 2, and the noise is multiplied by a gain, such that the noise appears in the output signals OIP and OIN.

$$V_N^2 = 4kTR \cdot BW \qquad \text{Equation 2}$$

In Equation 2, $V_N$ indicates a noise voltage, k indicates a Boltzmann constant (=1.38*10−23), T indicates an absolute temperature, R indicates an input resistor value of the first filter stage 202, and BW indicates a bandwidth.

A noise figure required for an analog baseband filter is less than 30 dB, which corresponds to noise introduced at a resistance of 50 kΩ that is 100 times a reference resistance of 50Ω. Therefore, an input resistor value of each filter cannot be higher than a maximum of 50 kΩ. In addition, a gain of each filter ranges from 0 dB to 24 dB, such that a feedback resistor value is 1/6 through 1 of the input resistor value. As described above, in order to process all bandwidths of 2G and 4G, a 100-times or 100-fold frequency range from the lowest frequency is required. Hence, in order to obtain a desired cut-off frequency with control of a resistor value instead of a capacitance value, a 1600-fold gain range from the minimum gain is needed. At the same time, in order to obtain a 24 dB gain when an input resistor value of 500 kΩ, which is 1/100 of a maximum input resistor value of 50 kΩ, is used, then the feedback resistor value is 31.25Ω according to Equation 2, thus significantly degrading output impedance, and thus failing in obtaining a desired gain and intensifying signal distortion.

Therefore, in the following exemplary embodiment of the present invention, an analog baseband filter circuit is configured to allow signal chains for frequency bands of an HB mode to be used also in an LB mode. For example, Q channel signal paths for a PRB HB and a DRX HB of an HB mode are shared with the LB mode. As another example, I channel signal paths for the PRB HB and the DRX HB of the HB mode are shared with the LB mode.

Figure 3A:
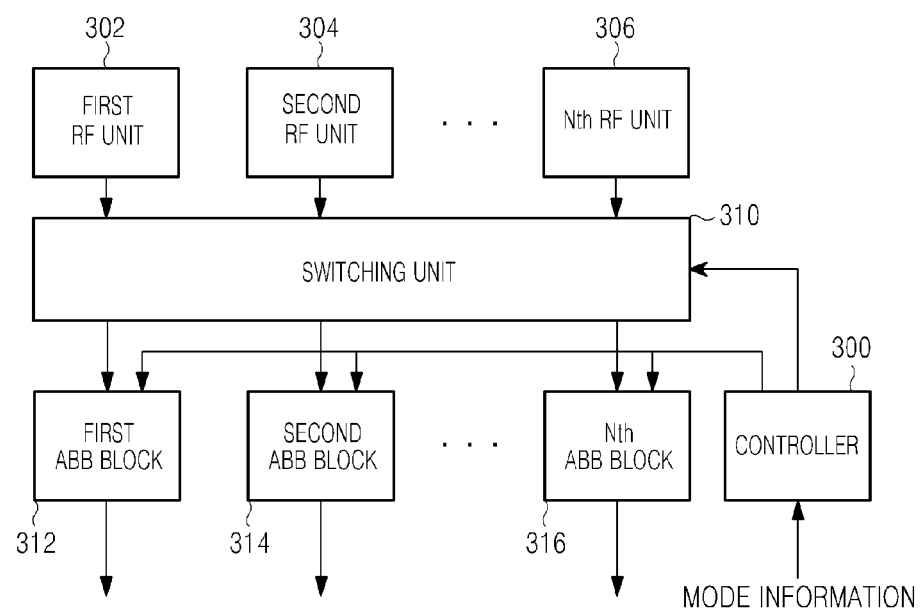
FIG. 3A is a diagram illustrating a structure of a reception apparatus which supports a plurality of high-band modes according to an exemplary embodiment of the present invention.

FIG. 3A is a diagram illustrating a structure of a reception apparatus which supports a plurality of HB modes according to an exemplary embodiment of the present invention.

Referring to FIG. 3A, the reception apparatus includes a plurality of RF units including a first RF unit 302, and a second RF unit 304 through an Nth RF unit 306 for RF processing of an HB or LB signal. However, the present invention is not limited thereto, and the reception apparatus may include any suitable and or similar number of RF units. The reception apparatus also includes a plurality of Analog BaseBand (ABB) blocks including a first ABB block 312, and a second ABB block 314 through an Nth ABB block 316 for baseband signal processing. However, the present invention is not limited thereto, and the reception apparatus may include any suitable and/or similar number of RF units. Additionally, the reception apparatus includes a switching unit 310 for connection between the RF units 302, 304, and 306 and the ABB blocks 312, 314, and 316, and a controller 300 for controlling the switching unit 310 according to a selected communication mode.

The first through Nth RF units 302, 304, and 306 perform RF processing for an I or Q path of a frequency band according to the selected communication mode. In an exemplary embodiment of the present invention, the first RF unit 302 is configured to perform signal processing of a first HB and signal processing of an LB. In an HB mode, the first RF unit 302 receives an RF signal of the HB and converts the received RF signal into an I or Q signal of a baseband, and in an LB mode, the first RF unit 302 receives an RF signal of an LB and converts the received RF signal to an I or Q signal of a baseband.

The first through Nth ABB blocks 312, 314, and 316 individually process a baseband signal corresponding to an HB or process a baseband signal corresponding to an LB in association with other adjacent ABB blocks. To be more specific, the first ABB block 312 and the second ABB block 314 individually operate in an HB mode, however, in an LB mode, the two blocks 312 and 314 are concatenated to process a signal of an LB. In order to process the signal of the LB together, the first ABB block 312 and the second ABB block 314 are arranged symmetrically to each other. More specifically, a capacitor region of the first ABB block 312 is disposed adjacent to a capacitor region of the second ABB block 314, such that the capacitor regions of the first ABB block 312 and the second ABB block 314 may be connected to each other in the LB mode.

The switching unit 310 connects the first through Nth RF units 302, 304, and 306 with the first through Nth ABB blocks 312, 314, and 316 according to the selected communication mode, under control of the controller 300. The controller 300 controls the overall operation of the reception apparatus, and controls the switching unit 310 according to whether a desired communication mode is the LB mode or the HB mode. More specifically, in the HB mode, the switching unit 310 connects the first RF unit 302 to the first ABB block 312, the second RF unit 304 to the second ABB block 314, and the Nth RF unit 306 to the Nth ABB block 316.

In the LB mode, if the first RF unit 302 is configured to receive the RF signal of the LB, the switching unit 310 connects the first RF unit 302 to the second ABB block 314 and a capacitor region of the second ABB block 314 is expanded to include a capacitor region of the first ABB block 312. For such expansion, the capacitor region of the second ABB block 314 is disposed adjacent to the capacitor region of the first ABB block 312, such that in the LB mode, the two capacitor regions are concatenated to each other to process, i.e., to filter and amplify, a baseband signal corresponding to the LB. Likewise, at least two other ABB blocks are connected to other RF units in order to process a baseband signal corresponding to the LB.

Figure 3B:
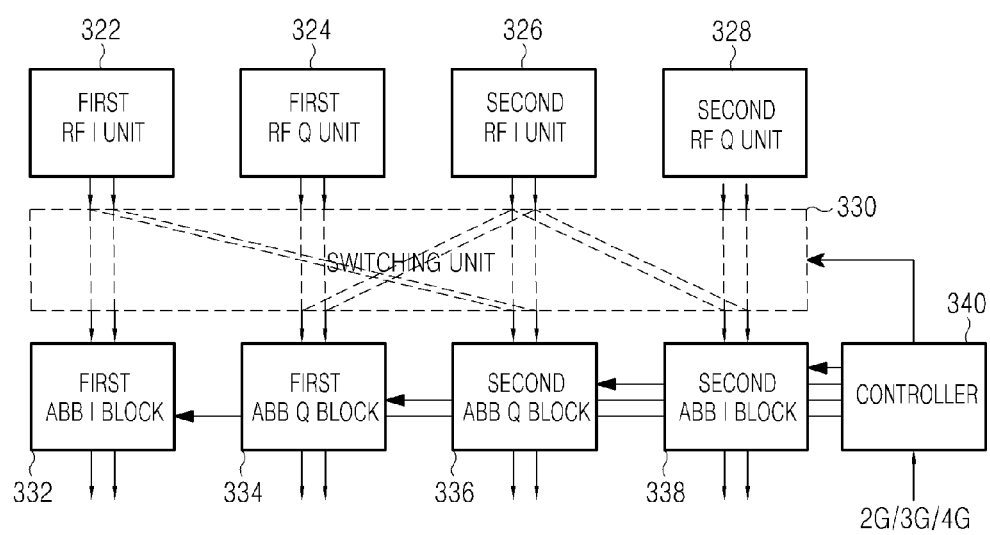
FIG. 3B is a diagram illustrating a structure of a terminal apparatus which supports first and second high-band modes according to an exemplary embodiment of the present invention.

FIG. 3B is a diagram illustrating a structure of a terminal apparatus which supports first and second HB modes according to an exemplary embodiment of the present invention.

Referring to FIG. 3B, the terminal apparatus includes a first RF I unit 322 and a first RF Q unit 324 for I/Q paths of a first HB and a second RF I unit 326 and a second RF Q unit 328 for I/Q paths of a second HB, a first ABB I block 332 and a first ABB Q block 334 for baseband I/Q paths corresponding to the first HB, a second ABB Q block 336 and a second ABB I block 338 for baseband I/Q paths corresponding to the second HB, a switching unit 330 for connection between the RF units 322, 324, 326, and 328 and the ABB blocks 332, 334, 336, and 338, and a controller 340 for controlling the switching unit 330 according to a communication mode.

The first RF I unit 322 and the first RF Q unit 324 for an I path of the first HB may be configured to operate as RF units for an I or Q path of an LB. Furthermore, the second RF I unit 326 and the second RF Q unit 328 for an I path of the second HB may be configured to operate as RF units for I and Q paths of the LB. When the terminal operates in a 2G mode, the first RF I unit 322 and the first RF Q unit 324 or the second RF I unit 326 and the second RF Q unit 328 receive an RF signal of a 2G band and convert the received RF signal into baseband I/Q signals. If the terminal operates in 3G/4G modes, the first RF I/Q units 322 and 324 receive RF signals of the first HB and convert the RF signals into baseband I/Q signals, and the second RF I unit 326 and the second RF Q unit 328 receive RF signals of the second HB and convert the RF signals into baseband I/Q signals.

The ABB blocks 332, 334, 336, and 338 are configured to individually process I/Q signals corresponding to the first or second HB or to process I/Q signals corresponding to the LB in pairs. More specifically, the first ABB I block 332 and the first ABB Q block 334 individually operate in the 3G/4G modes, but in the 2G mode, they process an I signal or a Q signal of the LB. Likewise, the second ABB Q block 336 and the second ABB I block 338 individually operate in the 3G/4G modes, but in the 2G mode, they process a Q signal or an I signal of the LB together. To process the I/Q signals of the 2G mode together, the first ABB I block 332 and the first ABB Q block 334 and the second ABB I block 336 and the second ABB Q block 338 are disposed symmetrically to each other. To be more specific, the second ABB Q block 336 is disposed adjacent to the first ABB Q block 334 such that in the 2G mode, capacitor regions included in the first ABB I block 332 and the first ABB Q block 334 are connected to each other and capacitor regions included in the second ABB I block 336 and the second ABB Q block 338 are connected to each other.

The switching unit 310 connects the RF units 322, 324, 326, and 328 with the ABB blocks 332, 334, 336, and 338 according to a selected communication mode under control of the controller 340. The controller 340 controls the overall operation of the terminal apparatus and controls the switching unit 330 according to whether a desired communication mode is the 2G mode or the 3G/4G modes. More specifically, in the 3G/4G modes, the switching unit 330 connects the first RF I unit 322 to the first ABB I block 332, the first RF Q unit 324 to the first ABB Q block 334, the second RF I unit 326 to the second ABB I block 338, and the second RF Q unit 328 to the second ABB Q block 336.

In the 2G mode, if the first RF I unit 322 and the first RF Q unit 324 are configured to receive an RF signal of a 2G LB, then the switching unit 330 connects the first RF Q unit 324 to the first ABB Q block 334 and the capacitor region of the first ABB Q block 334 is expanded to include the capacitor region of the first ABB I block 332. For such an expansion, the capacitor region of the second ABB Q block 336 is disposed adjacent to the capacitor region of the second ABB I block 338.

In another exemplary embodiment of present invention, in the 2G mode, if the second RF I unit 326 and the second RF Q unit 328 are configured to receive an RF signal of the 2G LB, the switching unit 330 connects the second RF I unit 326 to the first ABB Q block 334 and the capacitor region of the first ABB Q block 334 is expanded to include the capacitor region of the first ABB I block 332. The switching unit 330 connects the second RF Q unit 328 to the second ABB Q block 336 and the second ABB Q block 336 is expanded to include the capacitor region of the second ABB I block 338.

Figure 4A:
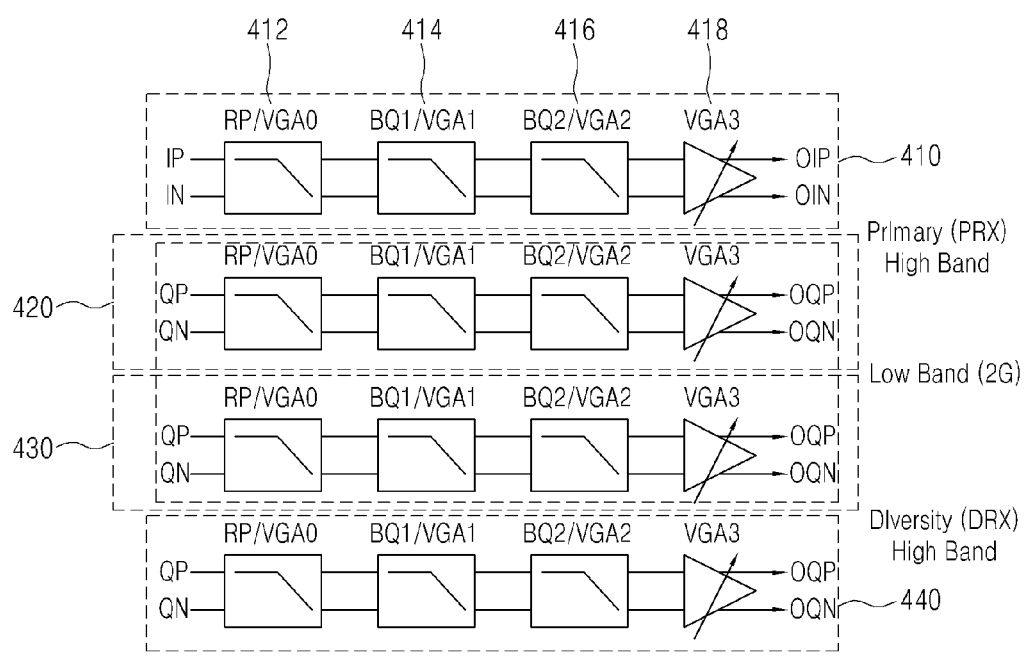
FIGS. 4A and 4B are a block diagram and a floor plan illustrating an analog baseband filter apparatus according to an exemplary embodiment of the present invention, respectively.
Figure 4B:
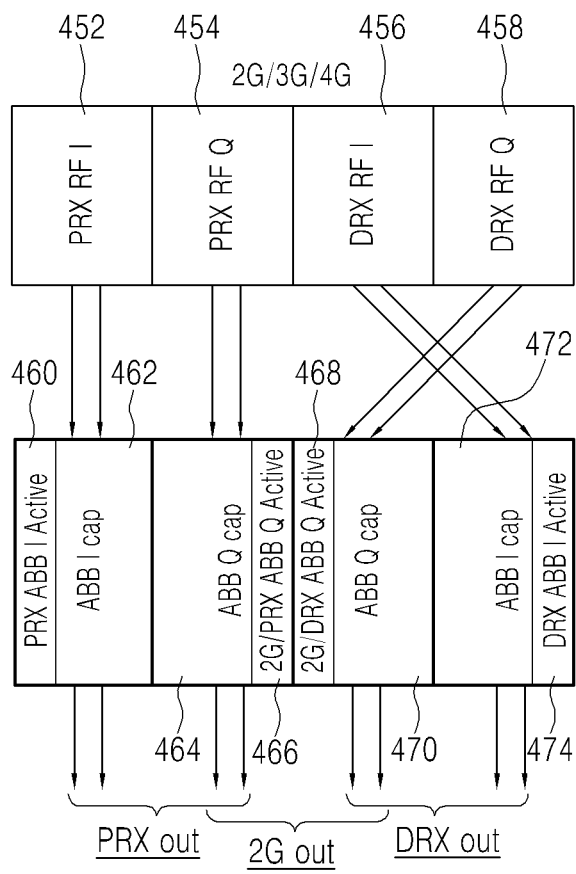

FIGS. 4A and 4B are a block diagram and a floor plan illustrating an analog baseband filter apparatus according to an exemplary embodiment of the present invention, respectively.

Referring to FIG. 4A, an analog baseband filter apparatus includes a first filtering/amplifying path 410 for an I signal of a PRX HB mode of the 3G/4G modes, a second filtering/amplifying path 420 for both a Q signal of the PRX HB mode and I/Q signals of an LB mode, a third filtering/amplifying path 430 for both a Q signal of a DRX HB mode and Q/I signals of the LB mode, and a fourth filtering/amplifying path 440 for an I signal of the DRX HB mode.

Each of the filtering/amplifying paths 410, 420, 430, and 440 include an RP filter, such as an RP filter 412, connected with (+) and (−) inputs, a first BQ filter, such as a first BQ filter 414, a second BQ filter, such as a second BQ filter 416, and a VGA, such as VGA 418, connected to (+) and (−) outputs.

As described before, the filtering/amplifying paths 420 and 430 of a primary Q channel and a diversity Q channel are configured to be used additionally for filtering/amplification of the 2G mode. That is, the filtering/amplifying paths 420 and 430 are shared for primary/diversity Q channels and I/Q channels of the 2G mode. In another exemplary embodiment of the present invention, primary/diversity I channels may share filtering/amplifying paths with the 2G mode, which may be easily conducted by those of ordinary skill in the art based on the drawings and the following description of the present exemplary embodiment.

As the filtering/amplifying paths 430 and 420 of the diversity I and Q channels are alternately disposed, the filtering/amplifying path 430 of the diversity Q channel is disposed adjacent to the filtering/amplifying path 420 of the primary Q channel such that when the filtering/amplifying paths 420 and 430 operate in the 2G mode, I channel path and Q channel path of the 2G mode are not spaced apart from each other.

Referring to FIG. 4B, a floor plan of a circuit corresponding to the analog baseband filtering/amplifying paths 410 through 440, which are shown in FIG. 4A, is illustrated. FIG. 4B shows a connection relationship between filter blocks corresponding to the filtering/amplifying paths 410 through 440 and RF units and an internal arrangement of the respective filter blocks.

Referring to FIG. 4B, a PRX RF I unit 452 and a PRX RF Q unit 454 for I and Q signals of a PRX HB and a DRX RF I unit 456 and a DRX RF Q unit 458 for I and Q signals of the DRX HB are shown. All or at least two of the PRX RF I unit 452 and the PRX RF Q unit 454 and the DRX RF I unit 456 and the DRZ RF Q unit 458 are configured to process I/Q signals of the 2G mode.

In the 3G/4G modes, the PRX RF I unit 452 receives an RF signal of the PRX HB, frequency down-converts the received RF signal to an I signal of a baseband, and forwards the baseband I signal to the corresponding first filter block having an active region 460 and a capacitor region 462. The PRX RF Q unit 254 receives a Q signal of the PRX HB and forwards the received Q signal to the corresponding second filter block having a capacitor region 464 and an active region 466, and the DRX RF I unit 456 receives an I signal of the DRX HB and forwards the received I signal to the corresponding third filter block having an active region 468 and a capacitor region 470. The DRX RF Q unit 458 receives a Q signal of the DRX HB and forwards the received Q signal to the corresponding fourth filter block having a capacitor region 472 and an active region 474. In the 2G mode, the PRX RF I unit 452 and the PRX RF Q unit 454 or the DRX RF I unit 456 and the DRZ RF Q unit 458 receive an RF signal of the 2G LB, frequency down-convert the received RF signal to I/Q signals of the baseband, and forward the baseband I/Q signals to the corresponding second and third filter blocks, in which capacitor regions 464 and 470 of the second and third filter blocks are expanded to include capacitor regions of other adjacent filter blocks.

The filter blocks are equivalent to the filtering/amplifying paths 410 through 440 of FIG. 4A. The first filter block includes the active region 460 including active elements such as a resistor and an OP AMP and the capacitor region 462 including capacitors, and is equivalent to the first filtering/amplifying path 410 of FIG. 4A. The second filter block includes the capacitor region 464 and the active region 466, and is equivalent to the second filtering/amplifying path 420 of FIG. 4A. The capacitor region 464 of the second filter block is disposed adjacent to the capacitor region 462 of the first filter block and is connected with the capacitor region 462 of the first filter block when operating in the 2G mode, thus expanding the capacitance of the capacitor. The third filter block includes the active region 468 and the capacitor region 470, and is equivalent to the third filtering/amplifying path 430 of FIG. 4A. The fourth filter block includes the capacitor region 472 and the active region 474, and is equivalent to the fourth filtering/amplifying path 440 of FIG. 4A. The capacitor region 470 of the third filter block is disposed adjacent to the capacitor region 472 of the fourth filter block and is connected with the capacitor region 472 of the fourth filter block when operating in the 2G mode, thus expanding the capacitor's capacitance.

As such, capacitor regions of two filter blocks are disposed adjacent to each other, such that the two capacitor regions are connected to support processing of a 2G mode signal.

Figure 5A:
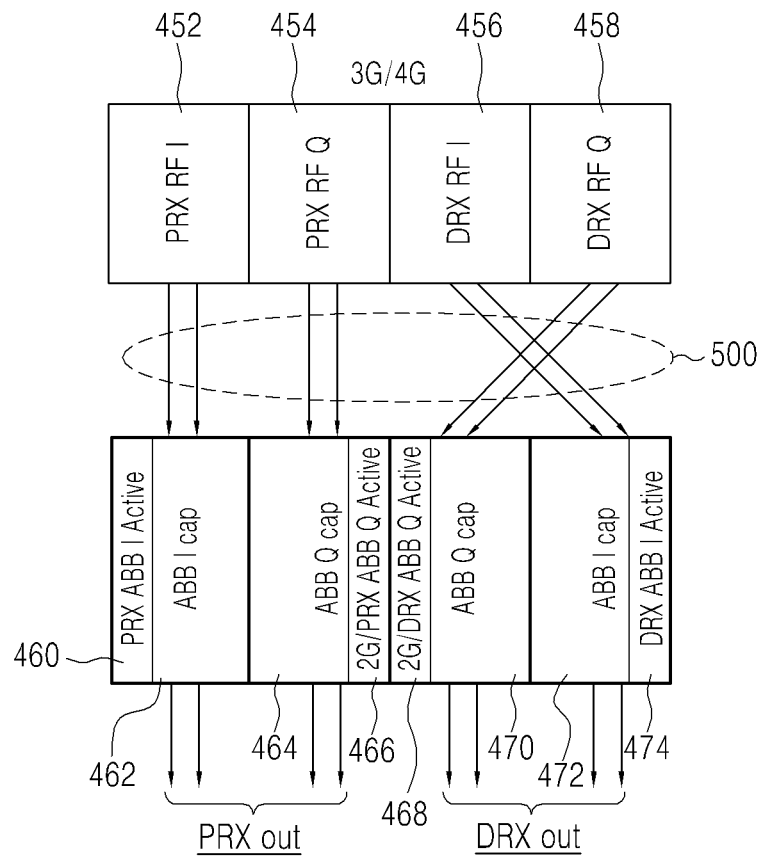
FIGS. 5A through 5C are diagrams for describing a mode change of an analog filter according to an exemplary embodiment of the present invention.
Figure 5B:
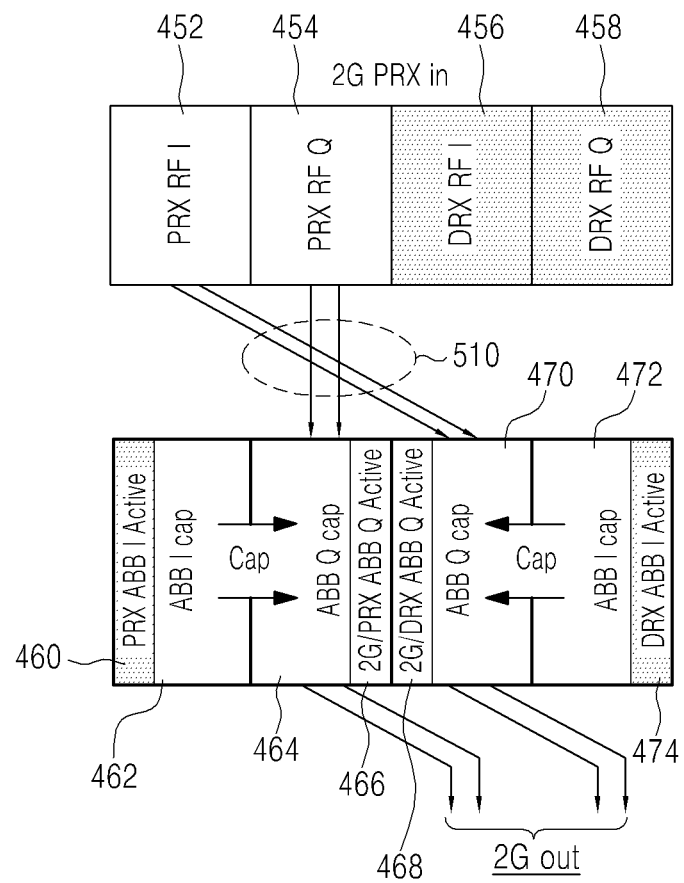
Figure 5C:
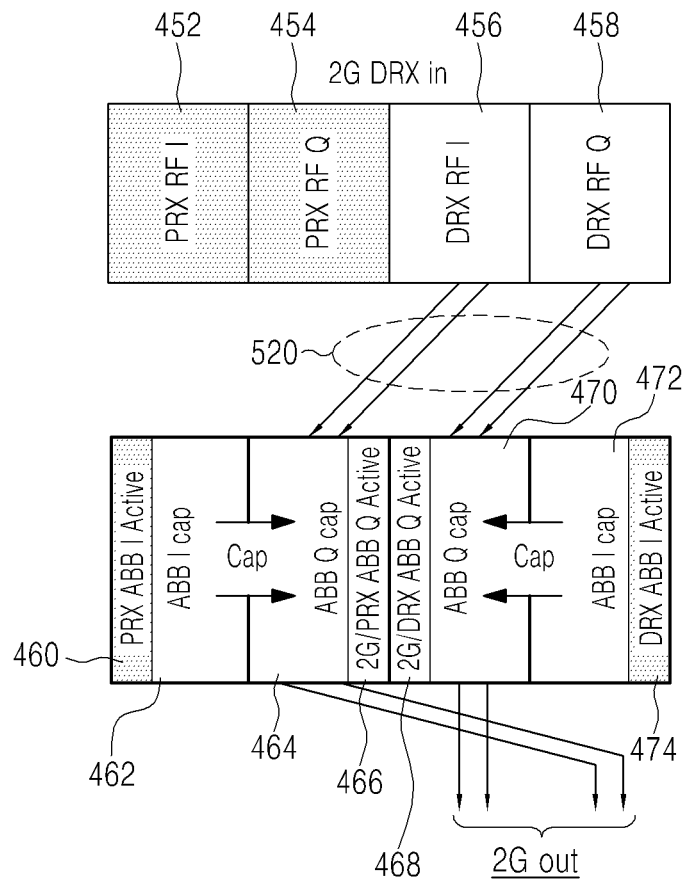

FIGS. 5A through 5C are diagrams for describing a mode change of an analog filter according to an exemplary embodiment of the present invention.

Referring to FIG. 5A, a signal flow in the 3G/4G modes is shown, referring to FIG. 5B, a signal flow when the PRX RF I unit 452 and the PRX RF Q unit 454 are used for the 2G mode is shown, and referring to FIG. 5C, a signal flow when the DRX RF I unit 456 and the DRX RF Q unit 458 are used for the 2G mode is shown.

In FIG. 5A, the PRX RF I unit 452 receives an RF signal of the PRX HB, frequency down-converts the received RF signal to an I signal of the baseband, and forwards the baseband I signal to the first filter block. The active region 460 and the capacitor region 462 of the first filter block operate for the I signal of the PRX HB. The PRX RF Q unit 454 receives an RF signal of the PRX HB, frequency down-converts the received RF signal to a Q signal of the baseband, and forwards the baseband Q signal to the second filter block. The capacitor region 464 and the active region 466 of the second filter block operate for the Q signal of the PRX HB.

The DRX RF I unit 456 receives an RF signal of the DRX HB, frequency down-converts the received RF signal to an I signal of the baseband, and forwards the baseband I signal to the fourth filter block. The capacitor region 472 and the active region 474 of the fourth filter block operate for the I signal of the DRX HB. The DRX RF Q unit 458 receives an RF signal of the DRX HB, frequency down-converts the received RF signal to a Q signal of the baseband, and forwards the baseband Q signal to the third filter block. The active region 468 and the capacitor region 470 of the third filter block operate for the Q signal of the DRX HB.

As such, in the 3G/4G modes, a PRX path and a DRX path are independently operated, and outputs from the RF units 452, 454, 456, and 458 are forwarded to the corresponding filter blocks through a switching unit 500.

As shown in FIGS. 5B and 5C, in the 2G mode, filter inputs are forwarded from the PRX RF I unit 452 and the PRX RF Q unit 454 or from the DRX RF I unit 456 and the DRX RF Q unit 458, such that they have a general purpose. When the PRX RF I unit 452 and the PRX RF Q unit 454 are used for the 2G mode, the DRX RF I unit 456 and the DRX RF unit 458 are turned off in order to prevent unnecessary power consumption. On the other hand, when the DRX RF I unit 456 and the DRX RF Q unit 458 are used for the 2G mode, the PRX RF I unit 452 and the PRX RF Q unit 454 are turned off to prevent unnecessary power consumption.

When the filter inputs are forwarded from the PRX RF I unit 452 and the PRX RF Q unit 454, channels are formed between the PRX RF I unit 452 and the PRX RF Q unit 454 and some of the regions 462 through 472 of the corresponding filter blocks through a switching unit 510, as shown in FIG. 5B.

More specifically, the PRX RF I unit 452 receives an RF signal of the LB, frequency down-converts the received RF signal to an I signal of the baseband, and forwards the baseband I signal to the third filter block through the switching unit 510. The capacitor region 470 of the third filter block is connected with the capacitor region 472 of the fourth filter block, such that the active region 468 and the capacitor region 470 of the third filter block and the capacitor region 472 of the fourth filter block operate for the I signal of the LB. Variable capacitors included in the capacitor region 472 of the fourth filter block vary by a control signal of the active region 468 of the third filter block. The active region 474 of the fourth filter block may enter a standby state to prevent unnecessary power consumption.

The PRX RF Q unit 454 receives an RF signal of the LB, frequency down-converts the received RF signal to a Q signal of the baseband, and forwards the baseband Q signal to the second filter block. The capacitor region 464 of the second filter block is connected with the capacitor region 462 of the first filter block, such that the capacitor region 462 of the first filter block and the capacitor region 464 and the active region 466 of the second filter block operate for the Q signal of the LB. Variable capacitors included in the capacitor region 462 of the first filter block vary by a control signal of the active region 466 of the second filter block. The active region 460 of the first filter block may enter the standby state for power saving.

If the filter inputs are forwarded from the DRX RF I unit 456 and the DRX RF Q unit 458, channels are formed between the DRX RF I unit 456 and the DRX RF Q unit 458 and some of the regions 462 through 472 of the filter blocks by a switching unit 520, as shown in FIG. 5C.

More specifically, the DRX RF I unit 456 receives an RF signal of the LB, frequency down-converts the received RF signal to an I signal of the baseband, and forwards the baseband I signal to the second filter block through the switching unit 520. The capacitor region 464 of the second filter block is connected with the capacitor region 462 of the first filter block such that the capacitor region 462 of the first filter block and the capacitor region 464 and the active region 466 of the second filter block operate for the I signal of the LB. The active region 460 of the first filter block may enter the standby state for power saving.

The DRX RF Q unit 458 receives an RF signal of the LB, frequency down-converts the received RF signal to a Q signal of the baseband, and forwards the baseband Q signal to the third filter block. The capacitor region 470 of the third filter block is connected with the capacitor region 472 of the fourth filter block, such that the active region 468 and the capacitor region 470 of the third filter block and the capacitor region 472 of the fourth filter block operate for the Q signal of the LB. The active region 474 of the fourth filter block may enter the standby state for preventing unnecessary power consumption.

As such, in the 2G mode, capacitors allocated to a neighbor path are connected in parallel to capacitors of a signal path for the 2G mode, thereby securing the expanded capacitor capacitance for signal process of the 2G mode.

A frequency range may be extended up to a 3-fold range by separate control of a capacitor bank according to a mode, and by capacitor sharing according to an exemplary embodiment of the present invention, a 6-fold frequency range may be supported. Moreover, each resistor of an analog filter may be replaced with four resistance segments which are connected in series or in parallel, thereby extending a resistor value to a 16-fold resistor value range. In this way, a frequency range may be extended up to a 96-fold range.

Figure 6:
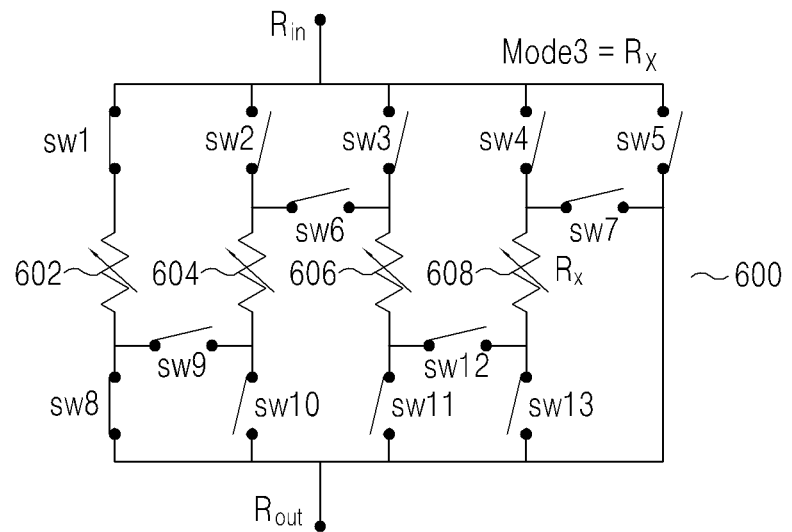
FIG. 6 is a diagram illustrating a resistor block which varies according to a mode according to an exemplary embodiment of the present invention.

FIG. 6 is a diagram illustrating a resistor block which varies according to a mode according to an exemplary embodiment of the present invention.

Referring to FIG. 6, the illustrated resistor block may substitute for at least one of the input resistor $R_a$ and the feedback resistor $R_b$ of an analog filter, and are controlled according to gain, cut-off frequency, and mode. As shown in FIG. 6, a resistor block 600 includes four variable resistance segments 602, 604, 606, and 608, which are connected in parallel between an input terminal $R_{in}$ and an output terminal $R_{out}$. Input stages of the respective resistance segments 602 through 608 are connected to the input terminal $R_{in}$ through switches sw1 through sw4 and output stages thereof are connected to the output terminal $R_{out}$ through switches sw8, sw10, sw11, and sw13. A switch sw9 is connected between the output stage of the first resistance segment 602 and the output stage of the second resistance segment 604. A switch sw6 is connected between the input stage of the second resistance segment 604 and the output stage of the third resistance segment 606. A switch sw12 is connected between the output stage of the third resistance segment 606 and the output stage of the fourth resistance segment 608. In addition, a switch sw5 is connected in parallel to the resistance segments 602 through 608, and a switch sw7 is connected between the input stage of the fourth resistance segment 608 and the output stage of the switch sw5.

When each resistance segment has a resistance $R_x$, the switches sw1 through sw13 are controlled according to a gain, a cut-off frequency, and a mode, such that a total resistance of the resistor block 600 may vary in a range of ¼ through 4 times of $R_x$.

According to an exemplary embodiment according to FIG. 6, only the switches sw1 and sw8 are turned on and the other switches are turned off. Thus, a total resistance of the resistor block 600 is $R_x$ due to the first resistance segment 602. By controlling on/off of the switches in this way, a total resistance of the resistor block 600 may be controlled to be in a range of ¼ through 4 times of $R_x$.

FIGS. 7A through 7F are diagrams illustrating diverse connections of a resistor block according to an exemplary embodiment of the present invention.

Figure 7A:
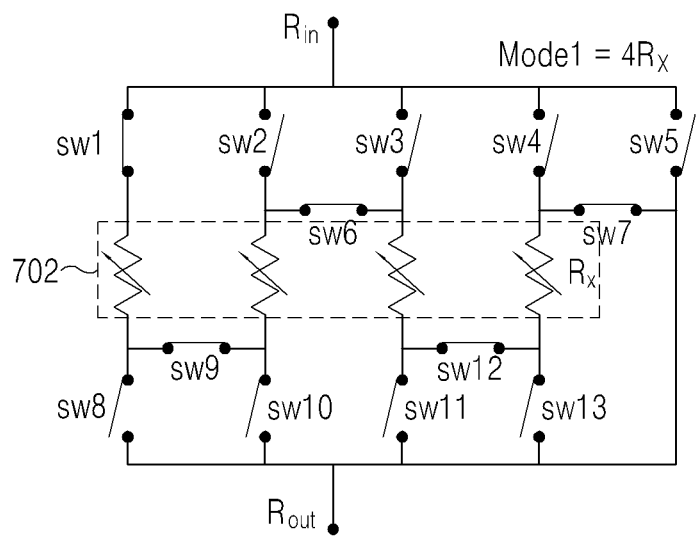
FIGS. 7A through 7F are diagrams illustrating diverse connections of a resistor block according to an exemplary embodiment of the present invention.

Referring to FIG. 7A, in Mode 1, such as the 2G mode, for processing the LB, four resistance segments 702 of the resistor block are serially connected by the switches sw1, sw9, sw6, sw12, and sw7, and the other switches are turned off, such that a total resistance is $4R_x$.

Figure 7B:
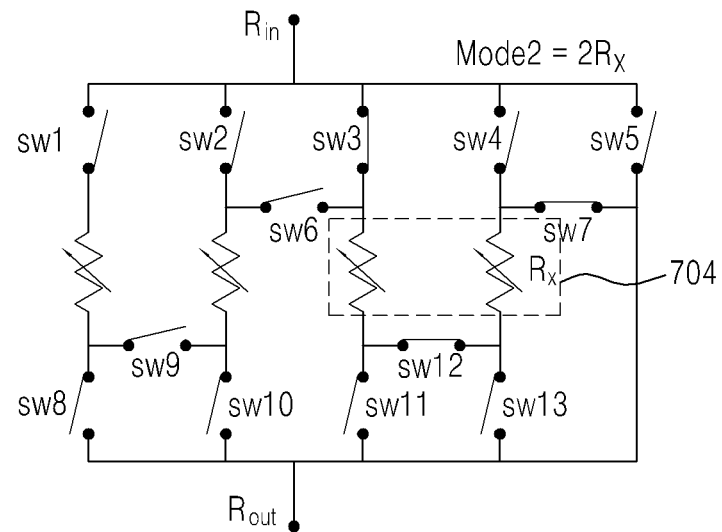

Referring to FIG. 7B, in Mode 2, third and fourth resistance segments 704 are serially connected by the switches sw3, sw12, and sw7, and the other switches are turned off, such that a total resistance is $2R_x$.

Figure 7C:
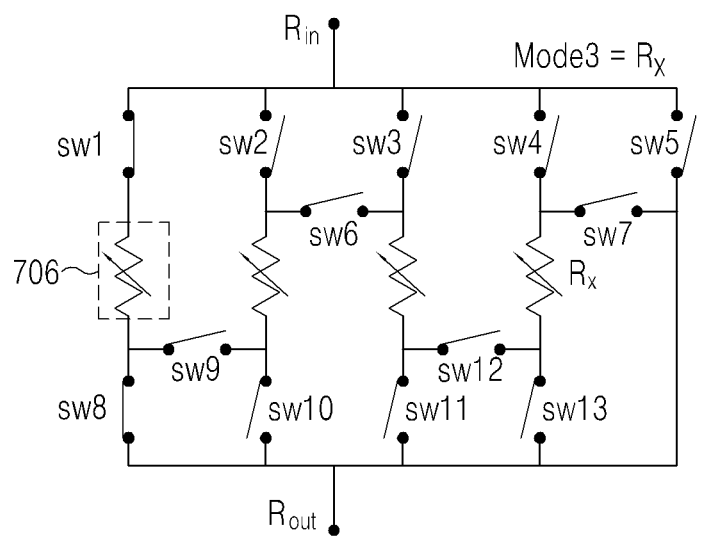

Referring to FIG. 7C, in Mode 3, only a first resistance segment 706 is connected between input and output terminals by the switches sw1 and sw8, and the other switches are turned off, such that a total resistance is $R_x$.

Figure 7D:
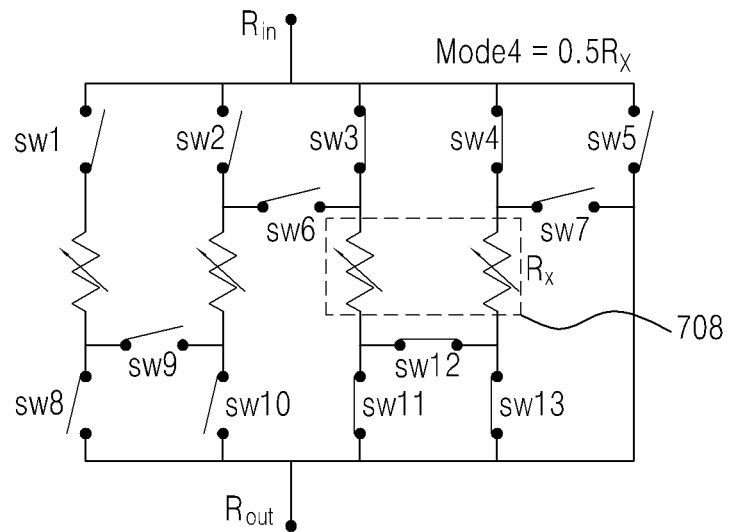

Referring to FIG. 7D, in Mode 4, third and fourth resistance segments 708 are connected between input and output terminals by the switches sw3, sw11, sw4, and sw13, and the other switches are turned off, such that a total resistance is $0.5R_x$.

Figure 7E:
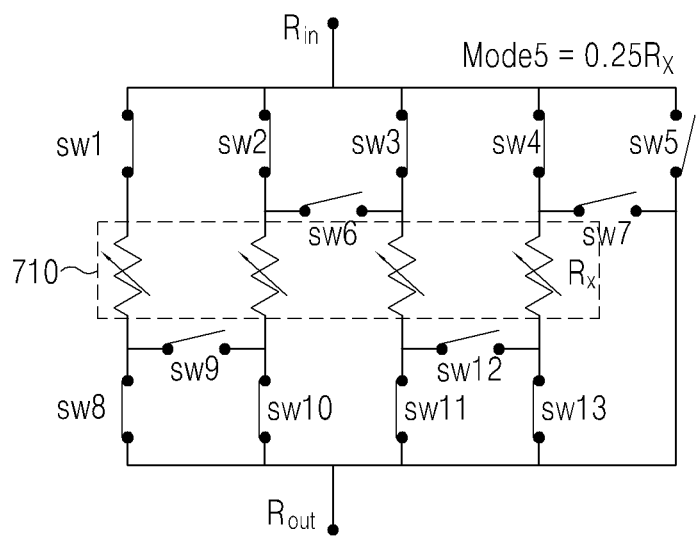

Referring to FIG. 7E, in Mode 5, four resistance segments 710 are connected in parallel between the input and output terminals by the switches sw1, sw2, sw3, sw4, sw8, sw10, sw11, and sw13, and the other switches are turned off, such that a total resistance is ¼$R_x$.

Figure 7F:
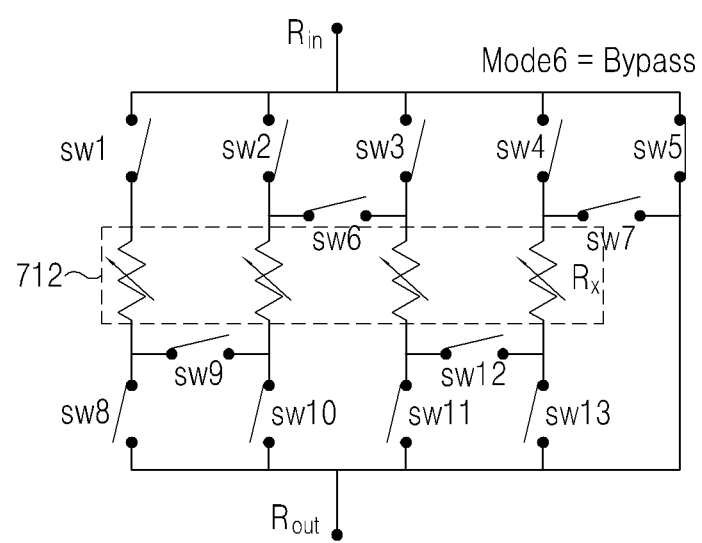

Referring to FIG. 7F, in Mode 6, which is a bypass mode, all switches except for the switch sw5 are turned off, such that the input and output terminals are directly connected without passing through resistance segments 712.

A unit resistance segment $R_X$ is configured to vary according to a gain needed for each filter stage, and generally, a desired gain ranges from −12 dB to +24 dB, and a rate of input resistance segments and feedback resistance segments is correspondingly adjusted.

Figure 8:
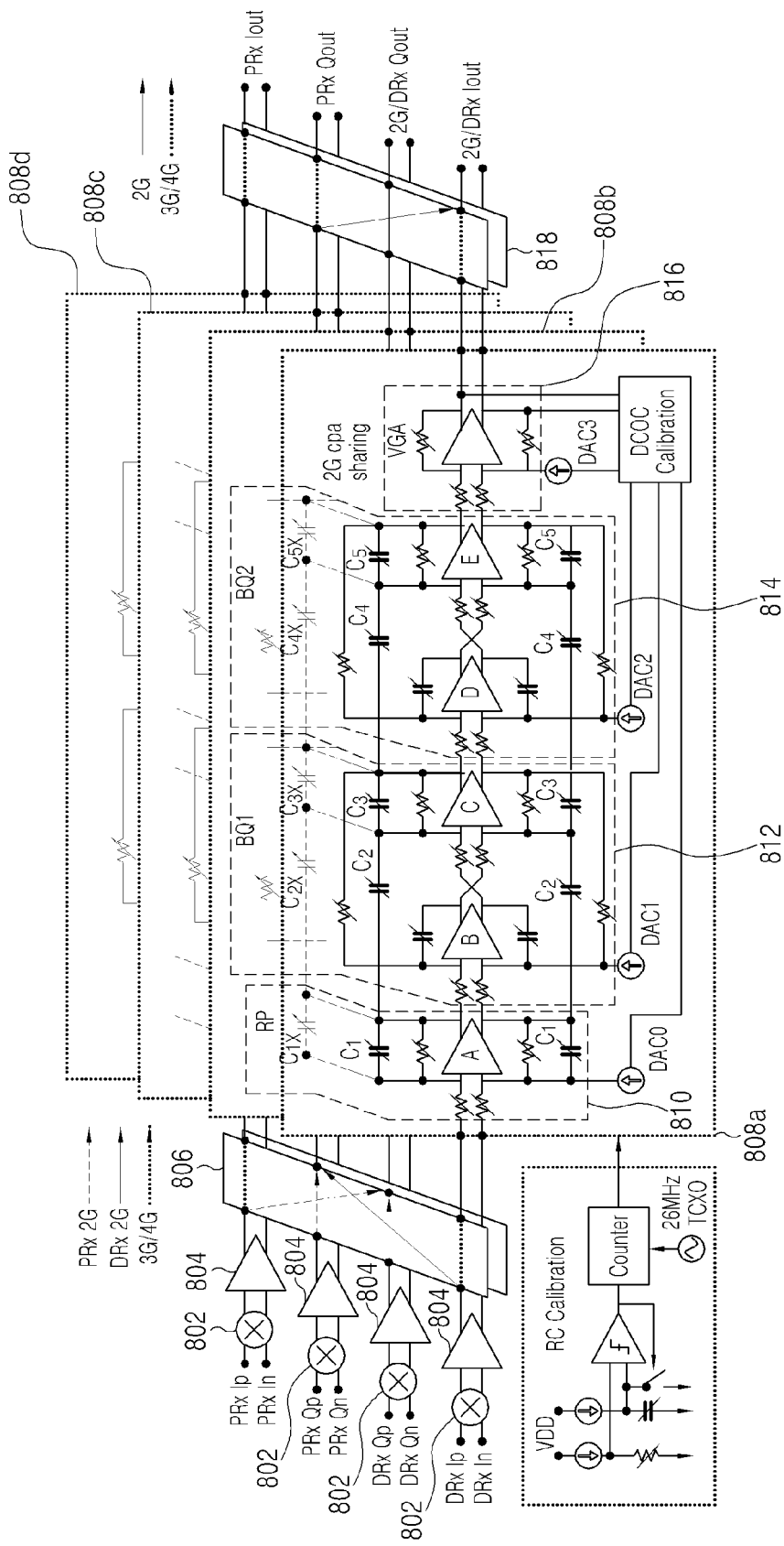
FIG. 8 is a circuit diagram of an analog baseband filter apparatus according to an exemplary embodiment of the present invention.

FIG. 8 is a circuit diagram of an analog baseband filter apparatus according to an exemplary embodiment of the present invention.

Referring to FIG. 8, the analog baseband filter apparatus includes four filter blocks 808a, 808b, 808c, and 808d, and a DRX I signal, a DRX Q signal, a PRX Q signal, and a PRX I signal are respectively input to an input switching unit 806 through respective ones of a plurality of frequency converters 802 and a plurality of amplifiers 804. The input switching unit 806 forwards the input signals to at least two of the filter blocks 808a through 808d according to a currently operating communication mode under control of a controller (not shown). In the 3G/4G modes, the input switching unit 806 forwards the four input signals to the four filter blocks 808a through 808d, respectively. In the 2G mode, the input switching unit 806 forwards 2G I and Q signals, which are input from DRX RF units through DRX I and Q input terminals, to the second and third filter blocks 808b and 808c, in which the 2G Q signal from the DRX RF Q unit is forwarded to the second filter block 808b and the 2G I signal from the DRX RF I unit is forwarded to the third filter block 808c. In another exemplary embodiment of the present invention, in the 2G mode, the input switching unit 806 forwards 2G I and Q signals, which are input from PRX RF units through PRX I and Q input terminals, to the second and third filter blocks 808b and 808c, in which the 2G Q signal from the PRX RF Q unit is forwarded to the third filter block 808c and the 2G I signal from the PRX RF I unit is forwarded to the second filter block 808c.

A description will be made of each filter block, representatively, the first filter block 808a. The first filter block 808a includes three filter stages and an amplification stage 816. The three filter stages include an RP filter 810, a first BQ filter 812, and a second BQ filter 814. The respective filter stages of the first filter block 808a independently operate in the 3G/4G modes, and are not connected with filter stages of the second filter block 808b. In the 2G mode, capacitors $C_1$ of the RP filter 810 are disconnected with an OP AMP A and are connected in parallel to capacitors $C_{1X}$ included in an RP filter of the second filter block 808b, and the OP AMP A is turned off. Likewise, in the 2G mode, capacitors $C_2$, $C_3$, $C_4$, and $C_5$ of the next filter stages are disconnected with OP AMPs B, C, D, and E and are connected in parallel to corresponding capacitors $C_{2X}$, $C_{3X}$, $C_{4X}$, and $C_{5X}$ of the second filter block 808b, and the OP AMPs B, C, D, and E are turned off.

Output signals of the filter blocks 808a through 808d are connected to corresponding output stages through an output switching unit 818 controlled by the controller. In the 3G/4G modes, the output switching unit 818 connects output signals from the filter blocks 808a through 808d to respective outputs including a DRX Iout, a DRX Qout, a PRX Qout, and a PRX Iout. In the 2G mode, the output switching unit 818 connects an output signal from the third filter block 808*c* to a 2G Iout output and an output signal from the second filter block 808*b* to a 2G Qout output.

Figure 9A:
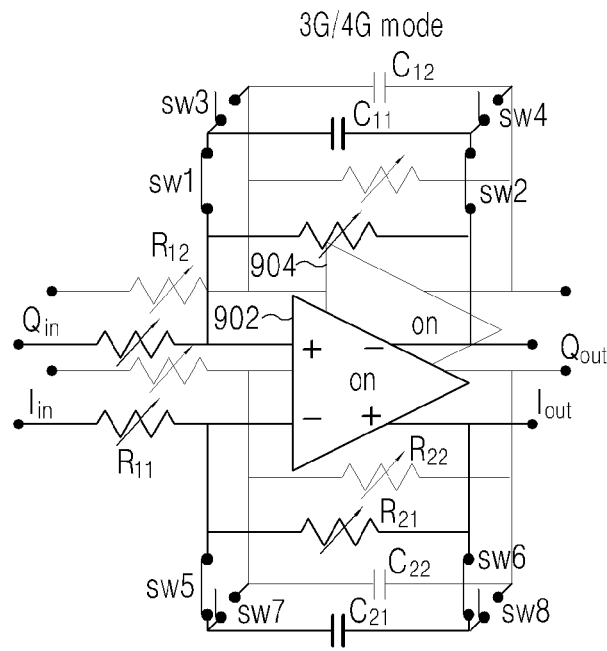
FIGS. 9A and 9B are diagrams illustrating in detail connection of capacitors according to an exemplary embodiment of the present invention.
Figure 9B:
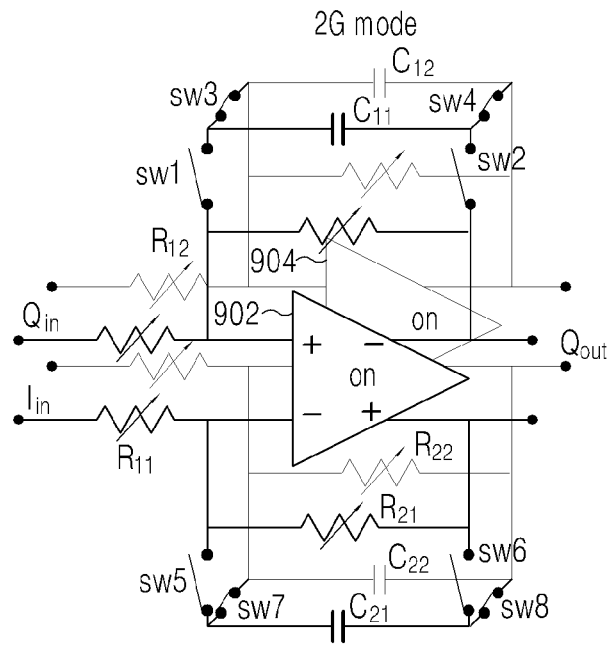

FIGS. 9A and 9B are diagrams illustrating in detail connection of capacitors according to an exemplary embodiment of the present invention.

Referring to FIG. 9A, a first OP AMP 902 is positioned in the first filter block 808*a* (see FIG. 8) and is connected in parallel to two capacitors $C_{11}$ and $C_{21}$. A second OP AMP 904 is positioned in the second filter block 808*b* (see FIG. 8) and is connected in parallel to two capacitors $C_{12}$ and $C_{22}$. The capacitor $C_{11}$ is connected in parallel with the first OP AMP 902 through the switches sw1 and sw2. The switch sw3 is connected between input stages of the capacitors $C_{11}$ and $C_{12}$, and the switch sw4 is connected between output stages thereof. Likewise, the capacitor $C_{21}$ is connected in parallel with the second OP AMP 904 through the switches sw5 and sw6. The switch sw7 is connected between input stages of $C_{21}$ and $C_{22}$, and the switch sw8 is connected between output stages thereof.

In the 3G/4G modes, the switches sw1 and sw2, which connect the capacitor $C_{11}$ to the first OP AMP 902, and the switches sw5 and sw6, which connect the capacitor $C_{21}$ to the second OP AMP 904, are turned on, or in other words, are closed, and the switches sw3 and sw4, which connect the capacitors $C_{11}$ and $C_{12}$ to each other, and the switches sw7 and sw8, which connect the capacitors $C_{21}$ and $C_{22}$ to each other, are turned off, or in other words, are opened. Accordingly, capacitors operate in a corresponding filter block.

Referring to FIG. 9B, in the 2G mode, the switches sw3 and sw4, which connect the capacitors $C_{11}$ and $C_{12}$ to each other, and the switches sw7 and sw8, which connect the capacitors $C_{21}$ and $C_{22}$ to each other, are turned on, and the switches sw1 and sw2, which connect the capacitor $C_{11}$ of the first filter block 808*a* to the first OP AMP 902, and the switches sw5 and sw6, which connect the capacitor $C_{21}$ of the first filter block 808*a* to the second OP AMP 904, are turned off. Accordingly, the capacitors $C_{11}$ and $C_{21}$ are connected in parallel to the second OP AMP 904 of the second filter block 808*b* instead of the first filter block 808*a*. In this case, the first OP AMP 902 of the first filter block 808*a* may be turned off in order to save power. Other filter stages and capacitors of other filter blocks are connected and controlled in a similar manner according to an applied communication mode, such that they may be shared between the 2G mode and the 3G/4G modes.

As is apparent from the foregoing description, in the 2G mode, a capacitor region for a diversity path of the 3G/4G modes is shared, and an architecture of input and feedback resistors is improved. In addition, a receiver system and a digital control code are provided in which input and output paths are variable according to a mode, such as a 2G mode and a 3G/4G mode. Therefore, according to the exemplary embodiments of the present invention, a variable-gain amplifier and filter circuit and algorithm may be provided in which a gain and a bandwidth needed for a baseband receiver are effectively implemented for all mobile communication standards supported in 2G, 3G, and 4G.

Moreover, when compared to the related art, the circuit area may be reduced by half or more, thereby reducing the cost and decreasing the noise in the circuit. Furthermore, in next-generation mobile communication techniques, the present invention may be effectively applied to configuration of a Multiple Input Multiple Output (MIMO) receiver structure such as a 4×2, a 4×4, an 8×4, or any other similar and/or suitable receiver structure.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An analog baseband filter apparatus for a multi-mode and multi-band wireless transceiver, the analog baseband filter apparatus comprising:
    a plurality of Radio Frequency (RF) units, each of the plurality of RF units being for receiving RF signals of one of a plurality of frequency bands and outputting baseband signals;
    a plurality of filter blocks for filtering and amplifying the baseband signals; and
    a switching unit for connecting at least two of the plurality of RF units to at least one of the plurality of filter blocks according to a selected communication mode,
    wherein the at least one of the plurality of filter blocks is configured to be connected to a capacitor region of an adjacent filter block from among the plurality of filter blocks.

2. The analog baseband filter apparatus of claim 1, wherein the plurality of RF units comprise at least one RF unit which is configured to output In-phase (I) and Quadrature-phase (Q) signals corresponding to an RF signal of a first High Band (HB) of the plurality of frequency bands in a first communication mode and output I and Q signals corresponding to an RF signal of a Low Band (LB) of the plurality of frequency bands in a second communication mode.

3. The analog baseband filter apparatus of claim 2, wherein the plurality of filter blocks comprise at least one filter block which is expanded to include a capacitor region of an adjacent filter block from among the plurality of filter blocks in the second communication mode, and receive I and Q signals of the LB from the at least one RF unit and filter and amplify the received I and Q signals.

4. The analog baseband filter apparatus of claim 3, wherein, when in the second communication mode, capacitor regions of the at least one filter block share active elements of the adjacent filter block, and the active elements of the adjacent filter block are turned off.

5. The analog baseband filter apparatus of claim 1, wherein capacitor regions of each of the filter blocks of the plurality of filter blocks are disposed adjacent to a capacitor region of an adjacent filter block of the plurality of filter blocks.

6. The analog baseband filter apparatus of claim 1, wherein each of the plurality of filter blocks comprises at least one of an input resistor and a feedback resistor,
    wherein, each of the at least one of the input resistor and the feedback resistor comprise a plurality of variable resistance segments configured to be connected in parallel or in series through switches, and
    wherein the switches are turned on or off according to a communication mode and a predetermined gain.

7. A method for controlling an analog baseband filter apparatus for a multi-mode and multi-band wireless transceiver, the method comprising:
    connecting a plurality of Radio Frequency (RF) units, each of the plurality of RF units being for receiving RF signals of a High Band (HB) and outputting baseband signals to a plurality of filter blocks for respectively filtering and amplifying the baseband signals in a first communication mode which uses the HB; and connecting two RF units from among the plurality of RF units to second and third filter blocks of the plurality of filter blocks in a second communication mode which uses a Low Band (LB), wherein, when in the second communication mode, capacitor regions of the second and third filter blocks are respectively connected with capacitor regions of respectively adjacent first and fourth filter blocks.

8. The method of claim 7, wherein the plurality of RF units comprise at least one RF unit which is configured to output In-phase (I) and Quadrature-phase (Q) signals corresponding to an RF signal of a first HB of the plurality of frequency bands in the first communication mode and output I and Q signals corresponding to an RF signal of the LB of the plurality of frequency bands in the second communication mode.

9. The method of claim 8, wherein the plurality of filter blocks comprise at least one filter block which is expanded to include a capacitor region of an adjacent filter block from among the plurality of filter blocks in the second communication mode, and receive I and Q signals of the LB from the at least one RF unit and filter and amplify the received I and Q signals.

10. The method of claim 9, wherein, when in the second communication mode, capacitor regions of the at least one filter block share active elements of the adjacent filter block, and the active elements of the adjacent filter block are turned off.

11. The method of claim 7, wherein capacitor regions of each of the filter blocks of the plurality of filter blocks are disposed adjacent to a capacitor region of an adjacent filter block of the plurality of filter blocks.

12. The method of claim 7, wherein each of the plurality of filter blocks comprises at least one of an input resistor and a feedback resistor, wherein, each of the at least one of the input resistor and the feedback resistor comprise a plurality of variable resistance segments configured to be connected in parallel or in series through switches, and wherein the switches are turned on or off according to a communication mode and a predetermined gain.

* * * * *